(12) United States Patent
Tuccio et al.

(10) Patent No.: US 6,219,249 B1
(45) Date of Patent: Apr. 17, 2001

(54) ELECTRICAL CABINET

(75) Inventors: William R. Tuccio, Sutton; William H. Stotz, Jr., Marlboro, both of MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/343,282

(22) Filed: Jun. 30, 1999

(51) Int. Cl.[7] .................................................. H05K 5/02
(52) U.S. Cl. ..................... 361/724; 361/727; 312/223.2; 400/713
(58) Field of Search ..................................... 361/724, 727, 361/725, 729, 683, 680, 681; 312/223.2, 223.3; 400/713, 714; 206/320, 576

(56) References Cited

U.S. PATENT DOCUMENTS

| | | | |
|---|---|---|---|
| 5,248,193 | * 9/1993 | Schlemmer | 312/223.2 |
| 5,612,854 | * 3/1997 | Wiscombe et al. | 361/727 |
| 6,038,126 | * 3/2000 | Weng | 361/679 |
| 6,088,224 | * 7/2000 | Gallagher et al. | 361/695 |

\* cited by examiner

*Primary Examiner*—Leo P. Picard
*Assistant Examiner*—Hung Van Duong
(74) *Attorney, Agent, or Firm*—Daly, Crowley & Mofford (57) ABSTRACT

A cabinet having a compartment disposed in an interior of the cabinet to house an electrical component. The compartment located at the base of the cabinet having Teflon rails and a stop. The compartment for holding a battery pack therein. The battery pack being slidably received into, and removed from the compartment. The battery pack engaging the stop of the cabinet, preventing the battery pack from being removed in a single sliding movement. The battery pack positioned at the base of the cabinet frame to lower its center of gravity, thus increasing the stability of the cabinet. The battery pack held firmly within the compartment during transportation of the cabinet by guide pins and finger screws.

12 Claims, 16 Drawing Sheets

ELECTRICAL CABINET

BACKGROUND OF THE INVENTION

This invention relates generally to an electrical cabinet and more particularly to a battery pack used to supply power to electrical components stored within such cabinet.

As is known in the art, batteries are typically used to store energy for electrical components housed within electrical cabinets. These batteries may be used to provide power for the electrical components at all times of their operation or may simply serve as a backup power supply to the components should a main power supply to the cabinet fail. Batteries may also be rechargeable, or replaceable, depending on their desired application.

Unfortunately, batteries are awkward to store in electrical cabinets as they are often bulky and quite heavy as compared to the electrical components that they power. Often these batteries require maintenance or must be replaced to ensure proper operation. Further, because of their size and weight such tasks of maintenance and replacement are difficult to perform.

Typically batteries are mounted within cabinets using screws and shelving. Such a structure has proven difficult for providing access to the batteries, even causing damage to the cabinets or surrounding components. Thus, a structure is needed to provide better access to batteries housed within electrical cabinets.

SUMMARY OF THE INVENTION

In accordance with the present invention, a cabinet is provided having compartments disposed in an interior of the cabinet for housing electrical components. In one of the compartments a battery pack is disposed. The battery pack has a housing which contains a plurality of batteries disposed side-by-side. The batteries are for storing power to be supplied to electrical components also housed within the cabinet. The housing is covered by a removable cover which can be removed to provide access to the batteries for maintenance or replacement thereof. The battery pack is positioned on a rail within the compartment. The rail provides a low friction surface for receiving and removing the battery pack, into, and out from, respectively, the compartment.

With such an arrangement, the electrical cabinet can effectively store the heavy and awkward sized batteries needed to supply power to the housed electrical components. The arrangement also allows the batteries to be removed easily for maintenance.

In accordance with other features of the invention, the battery pack is located in a compartment at the base of the cabinet. Such a position lowers the center of gravity of the cabinet, thus increasing its stability and its safety. The cabinet may also employ a stop to engage the battery pack preventing it from being removed from the cabinet in a single sliding motion. Such a stop also serves to increase the safety of the cabinet, preventing an accidental or uncontrollable removal of the battery pack from the cabinet.

In accordance with yet other features of the invention, the battery pack may have a pull handle and a lift handle to increase the ease of manually handling it as it is received into, or removed out from the cabinet. The pack may also have slots to accept the stops of the cabinet, a finger screw to secure the pack within the cabinet, a switch to control the functions of the batteries, a removable member to hold the batteries securely in place, and air vents to allow air to circulate within the battery pack cooling the batteries stored therein.

BRIEF DESCRIPTION OF THE DRAWING

These and other features of the invention will become more readily apparent from the following detailed description when read together with the accompanying drawings, in which.

DESCRIPTION OF THE PREFERRED EMBODIMENTS

Figure 1:
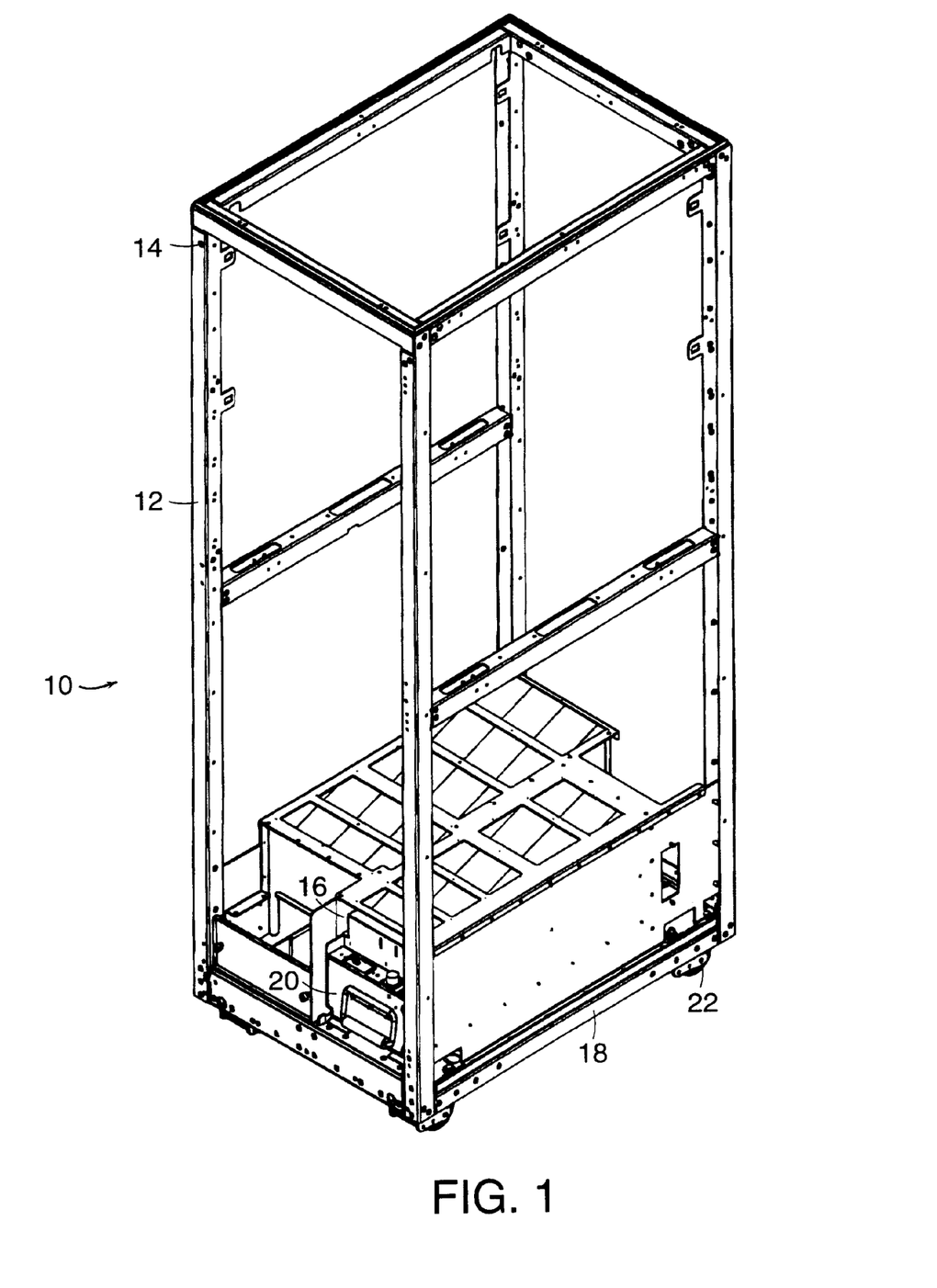
FIG. 1 is a perspective view of the frame of an electrical cabinet according to the invention.
Figure 2:
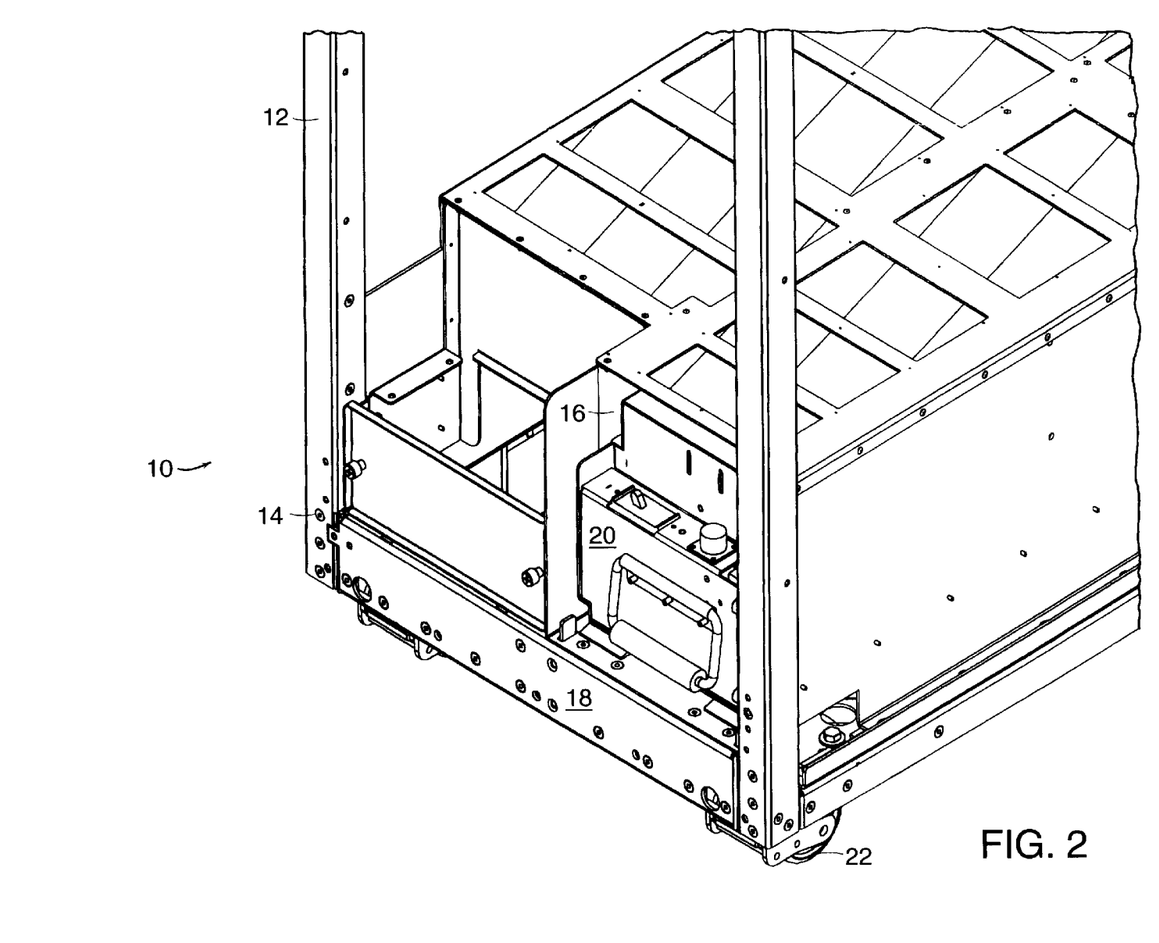
FIG. 2 is an enlarged view of a base portion of FIG. 1.

Referring now to FIGS. 1 and 2, a cabinet frame 10 defining an interior of an electrical cabinet is shown. The electrical cabinet has a covering, not shown, enclosing the cabinet frame 10 and a plurality of compartments disposed within the interior of the frame 10 configured to house various electrical components, also not shown. The frame 10 is manufactured here of metal members 12 riveted together by rivets 14. A compartment 16 is located at a base 18 of cabinet frame 10 to hold a battery pack 20. It is noted that the battery pack 20 contains a plurality of batteries 70 (FIG. 7) which together, here, weigh over 100 pounds. Thus, as such, a battery pack 20 is a substantial portion of the weight of the combined electrical components, not shown, housed within the cabinet frame 10.

Here, locating the battery pack 20 at the base 18 of cabinet frame 10 lowers the center of gravity of the cabinet. Such a positioning of battery pack 20 at base 18 near the ground on which cabinet frame 10 is supported increases the stability of cabinet, and therefore its safety, both as it is moved about on wheels 22, and as the battery pack 20 is receive into, or removed out from, compartment 16.

Figure 3:
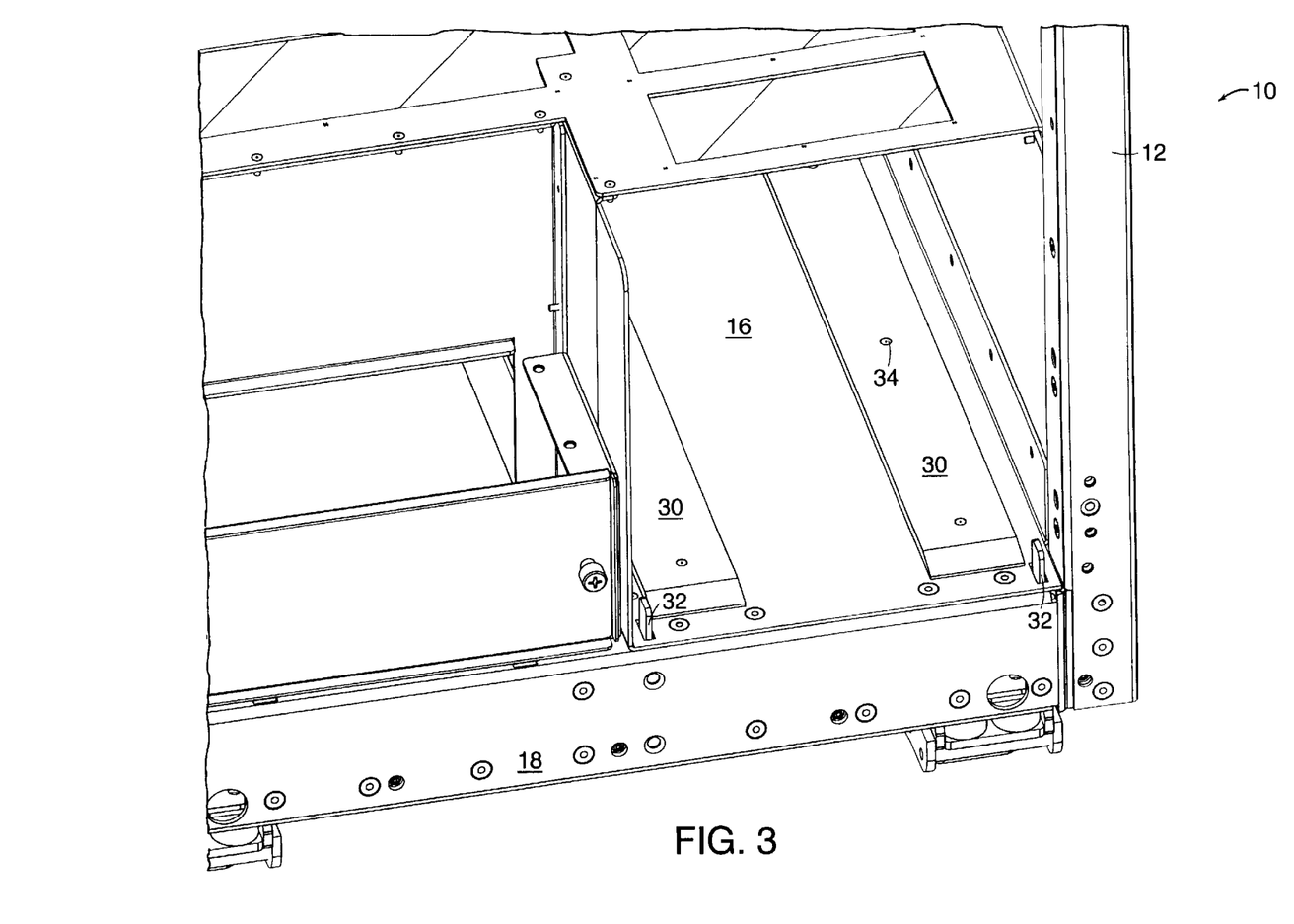
FIG. 3 is an enlarged, rotated view of FIG. 2 with the battery pack removed.

Referring to FIG. 3, the compartment 16 has rails 30 and stops 32 for engaging battery pack 20, here, removed from the cabinet frame 10. The battery pack 20 (FIG. 4) slides into and out from compartment 16 on rails 30 as it is received into and removed out from cabinet frame 10. In particular, here, rails 30 are attached to cabinet frame 10 by rivets 34 and are made of Teflon material to provide a low friction surface for sliding battery pack 20 into, and out from, compartment 16. Rail 16 preferably has a Teflon surface but it may also be made from any material creating a low friction surface, including rolling surfaces, which allow battery pack 20 to be received into and removed out from compartment 16 with ease.

Here, the battery pack 20 engages stops 32 as it is almost completely removed from compartment 16. The stops 32 ensure that battery pack 20 will not be removed to quickly from compartment 16. Such a configuration of compartment 16 reduces the likelihood that battery pack 20 will fall uncontrollably to the floor, possibly damaging the unit, as it is removed from the compartment 16. Stops 32 also help prevent injury to any person around cabinet frame 10 should battery pack 20 be removed uncontrollably from its compartment 16. This added safety measure is needed since battery pack 20, in some applications, may weigh well over 100 pounds.

Figure 4:
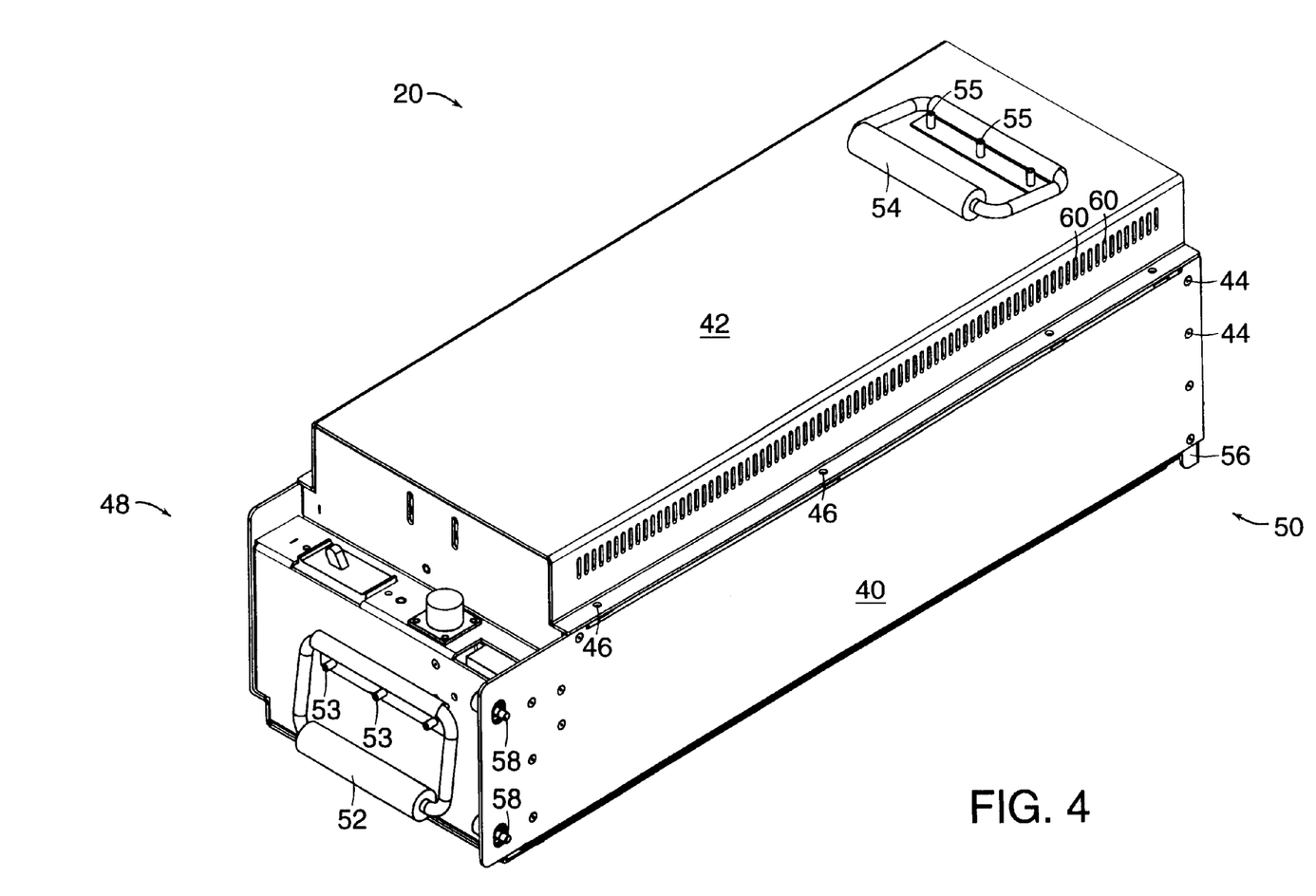
FIG. 4 is a front perspective view of the battery pack.
Figure 5:
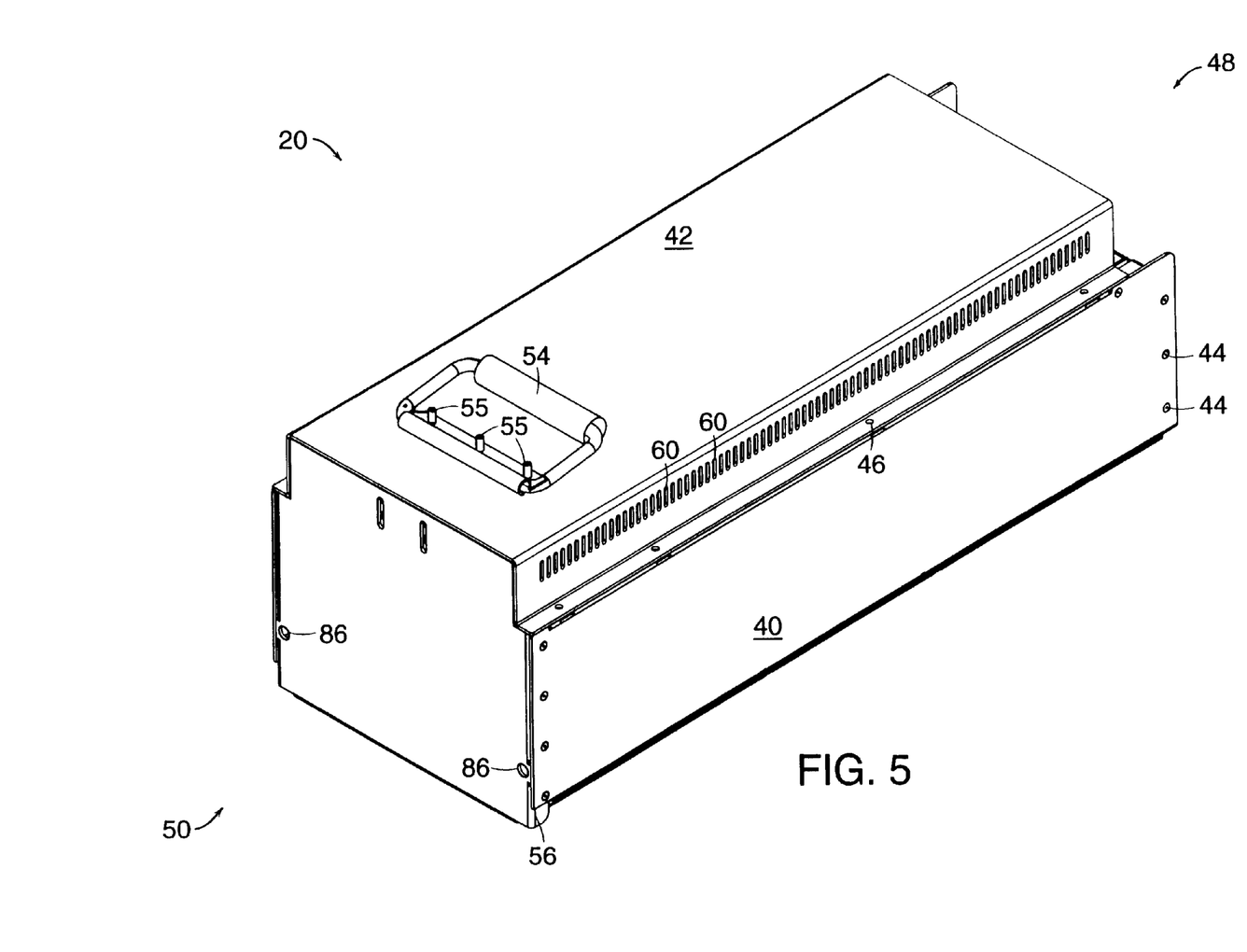
FIG. 5 is a rear perspective view of FIG. 4.

Referring to FIGS. 4 and 5, battery pack 20, which serves to shield and protect the batteries 70 (FIG. 7), has a housing 40 and a removable cover 42. Housing 40, here, is made of metal members riveted together by rivets 44.

Figure 6:
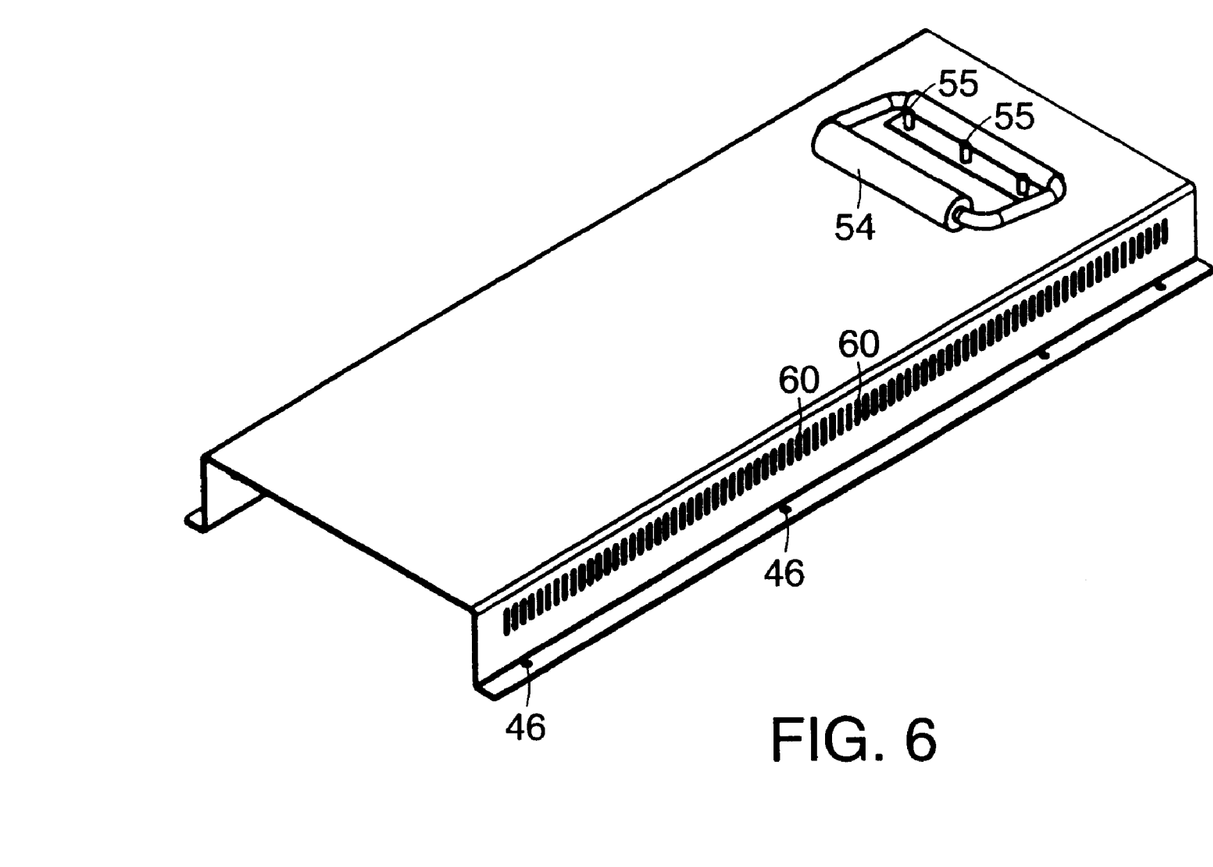
FIG. 6 is a perspective view of the cover.

Removable cover 42, better seen in FIG. 6, is also made of metal and is attached to housing 40 by screws, not shown, through screw holes 46. Such an attachment of cover 42 to housing 40 allows cover 42 to be removed from housing 40 providing access to batteries 70 stored inside. Cover 42 also has air vents 60 allowing air to circulate through battery pack 20, cooling the electrical components stored within.

Battery pack 20 has a front end 48 and a rear end 50. Here, front end 48 has a pull handle 52 and rear end 50 has a lift handle 54 to assist with the insertion and the removal of pack 20 into, and out from, compartment 16. Pull handle 52, attached to housing 40 by rivets 53, is provided to assist in manually sliding battery pack 20 from compartment 16. Lift handle 54, attached to removable cover 42 by rivets 55, is provided to assist with manually lifting the rear end 50 of battery pack 20 over stops 32. Such a lifting of rear end 50 of battery pack 20 over stops 32 is necessary because a back plate 56 of housing 40 engages stops 32 to prevent the battery pack 20 from being removed from cabinet frame 10 in a single sliding motion. Lift handle 54 is also used to lift rear end 50 of battery pack 20 over stops 32 to insert it into cabinet frame 10 so that it may be received into compartment 16.

The front end 48 of battery pack 20 also has, here, finger screws 58. Finger screws 58 function to secure battery pack 20 within compartment 16 by screwing into screw holes (not shown) within cabinet frame 10. Such a securing of battery pack 20 within cabinet frame 10 prevents it from sliding unintentionally about compartment 16.

Figure 16:
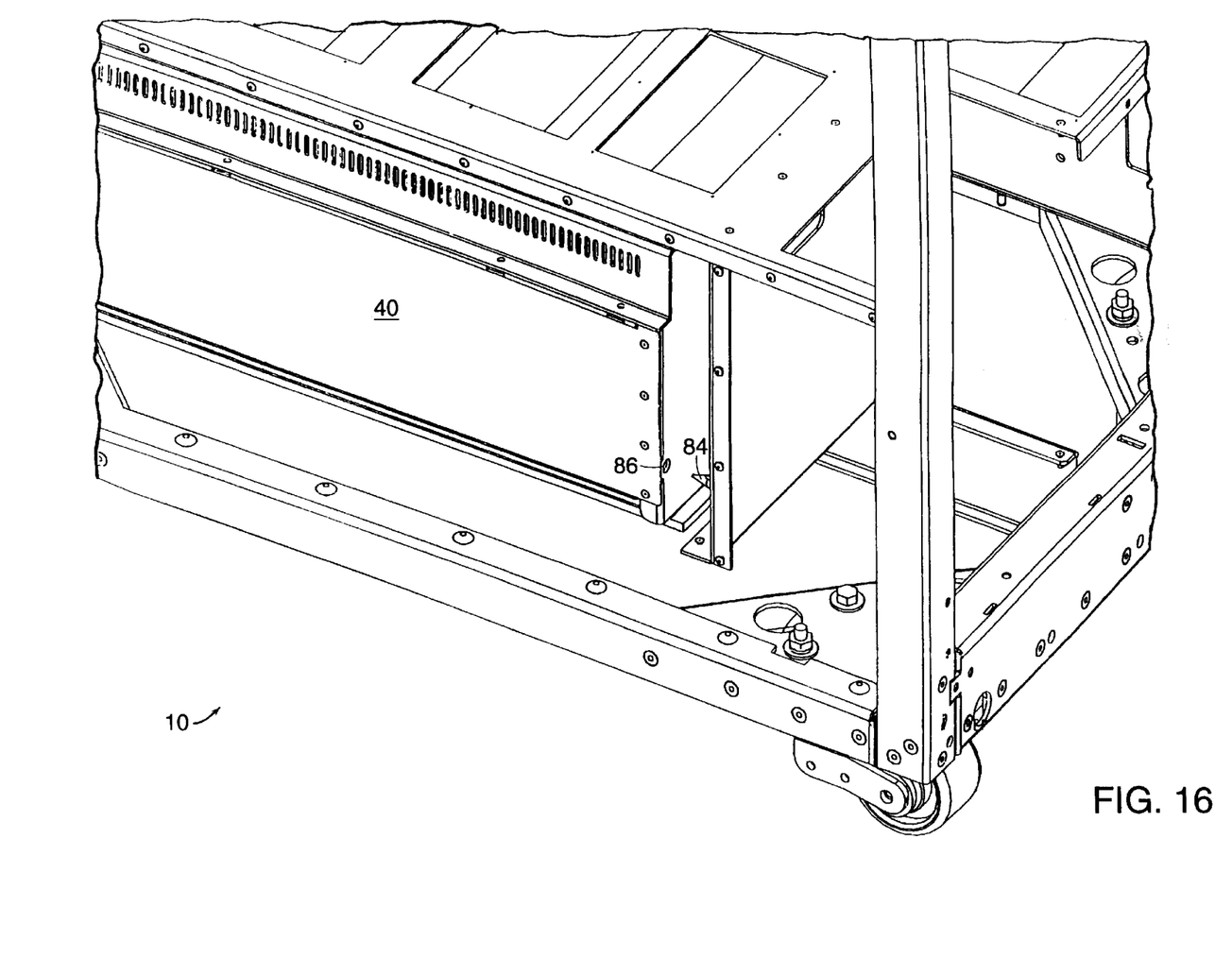
FIG. 16 is a perspective view of the rear corner of the electrical cabinet frame according to the invention showing the inside of a battery pack compartment.

The rear end 50 of battery pack 20 also has, here, holes 86. Holes 86, here in back plate 56, function to engage guide pins 84 (FIGS. 16) of compartment 16 of frame 10. As battery pack 20 is received completely within compartment 16 the holes 86 engage guide pins 84 securing the rear end 50 of battery pack 20 within the compartment 16. Such a structure, together with secured finger screws 58, keeps the battery pack 20 from shifting unintentionally about the compartment 16.

Figure 7:
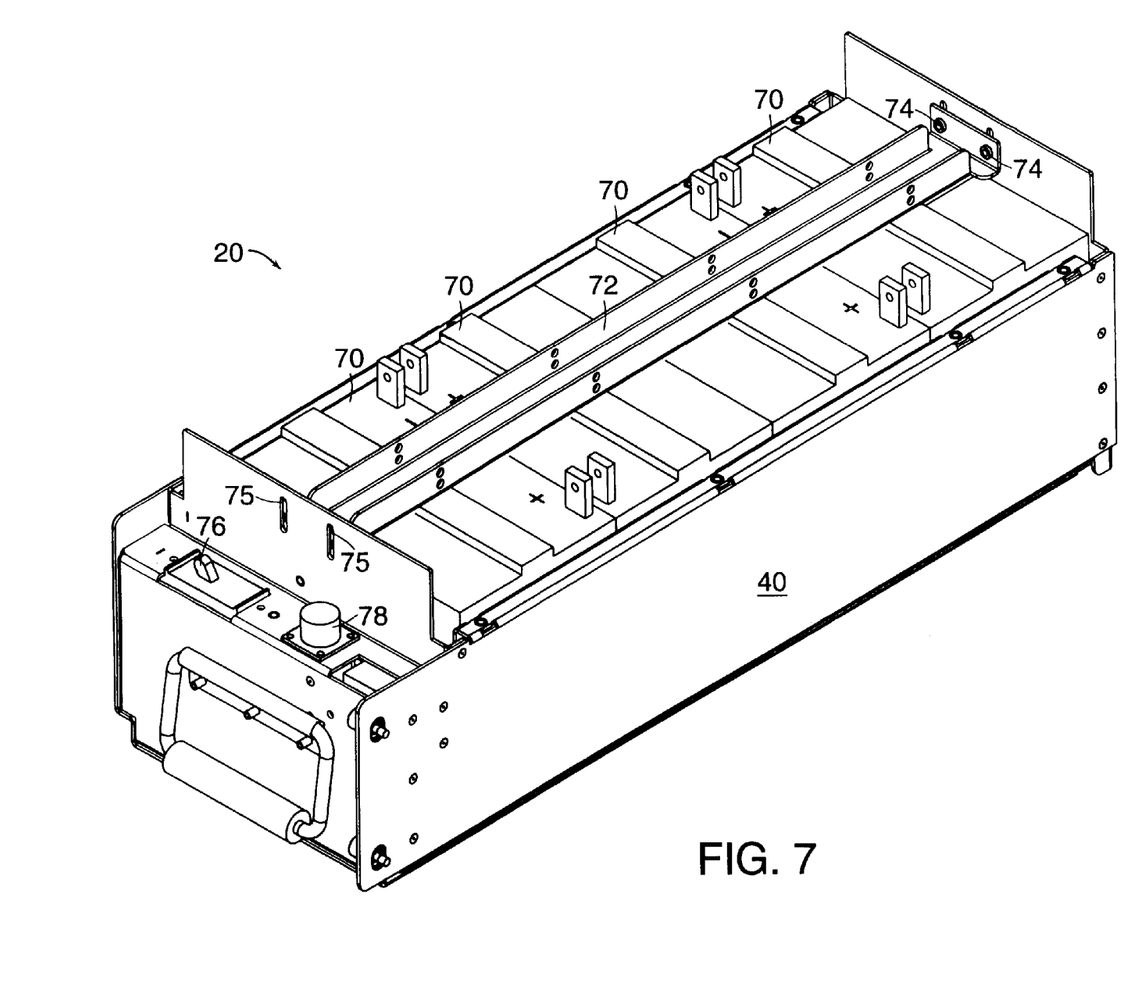
FIG. 7 is FIG. 4 with the cover removed.
Figure 8:
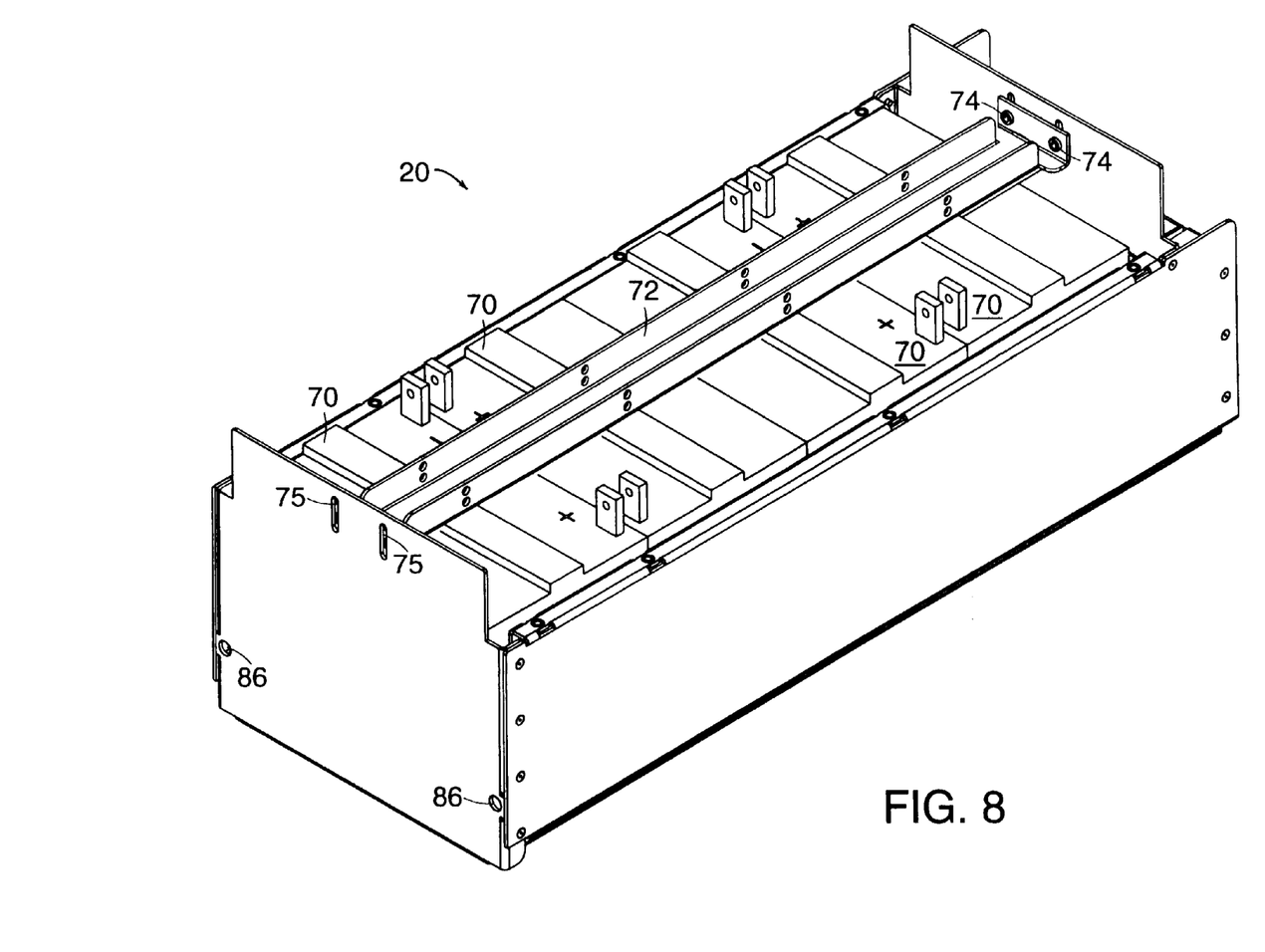
FIG. 8 is FIG. 5 with the cover removed.
Figure 9:
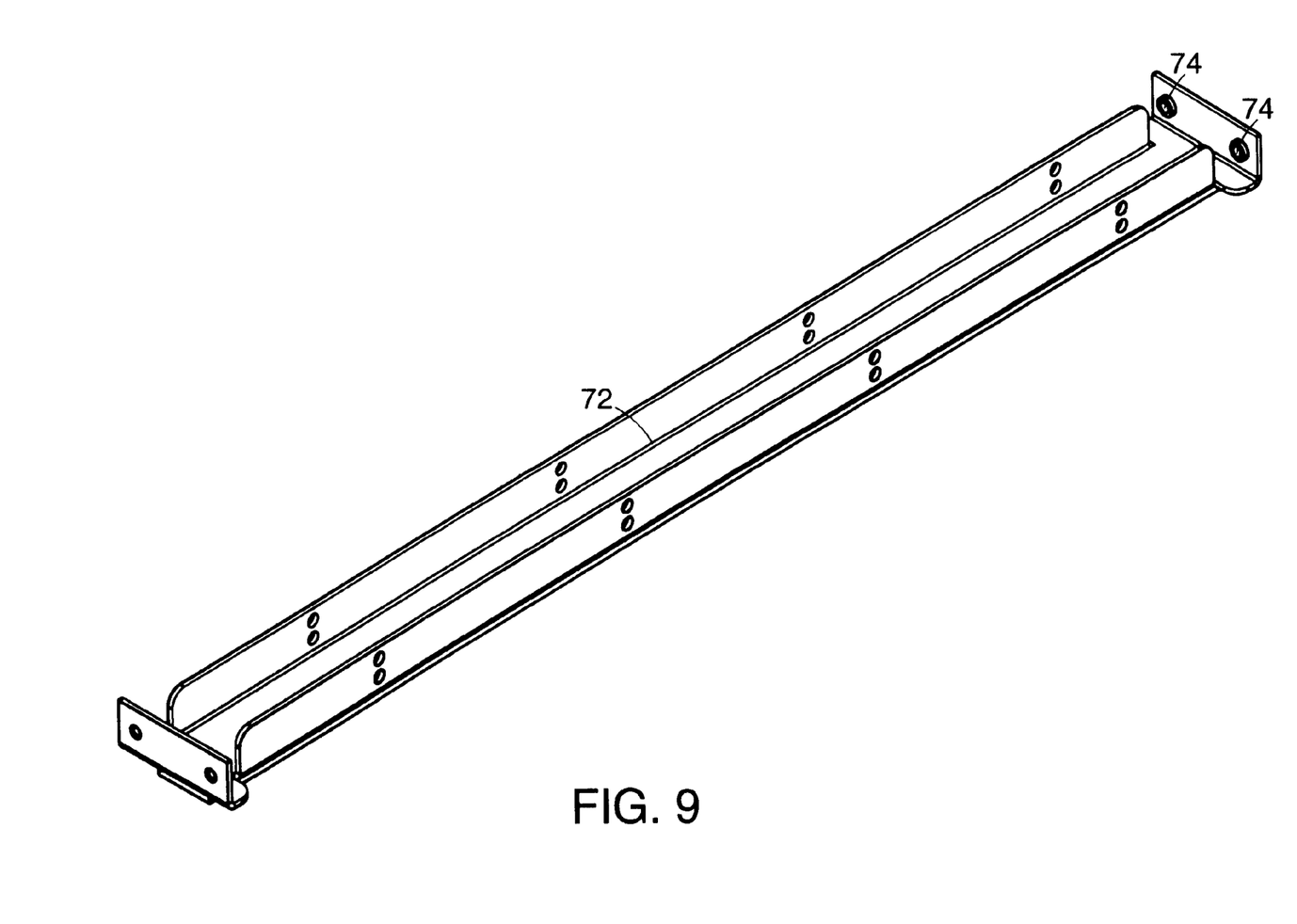
FIG. 9 is a perspective view of the removable member.

Referring now to FIG. 7 and 8, battery pack 20 is shown with cover 42 removed. A plurality of batteries 70, here four positioned side-by-side, are held within housing 40 by removable member 72. Removable member 72, better seen in FIG. 9, here is a metal bar attached to housing 40 by screws not shown, through screw holes 74 and slots 75.

The functions of batteries 70 are controlled by electrical components, not shown, stored within the front end of battery pack 20. A switch 76 and a dial 78 are, here, positioned at the front end of housing 40 to provide input to the stored electrical components for controlling batteries 70.

Figure 10:
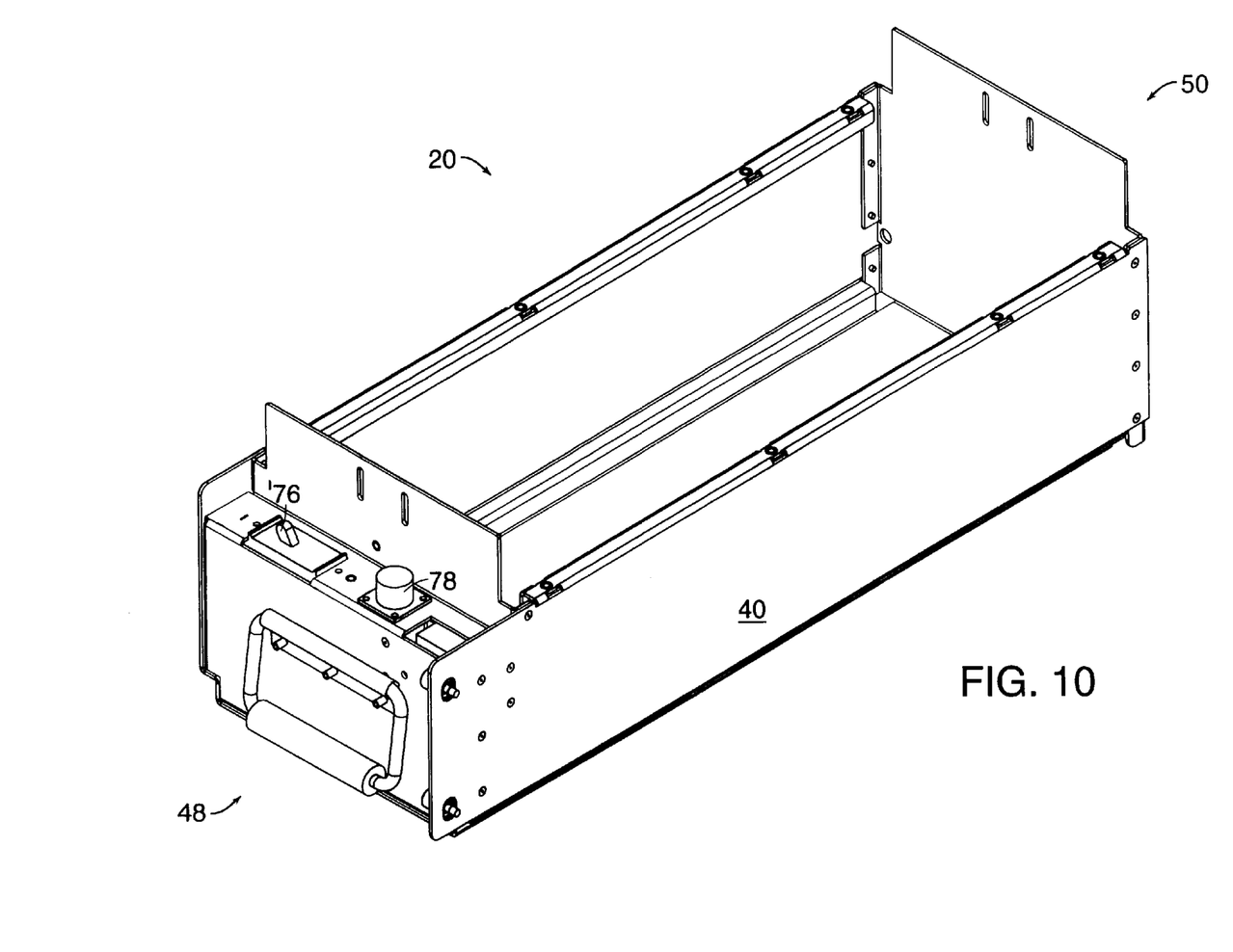
FIG. 10 is FIG. 4 with the batteries removed.
Figure 11:
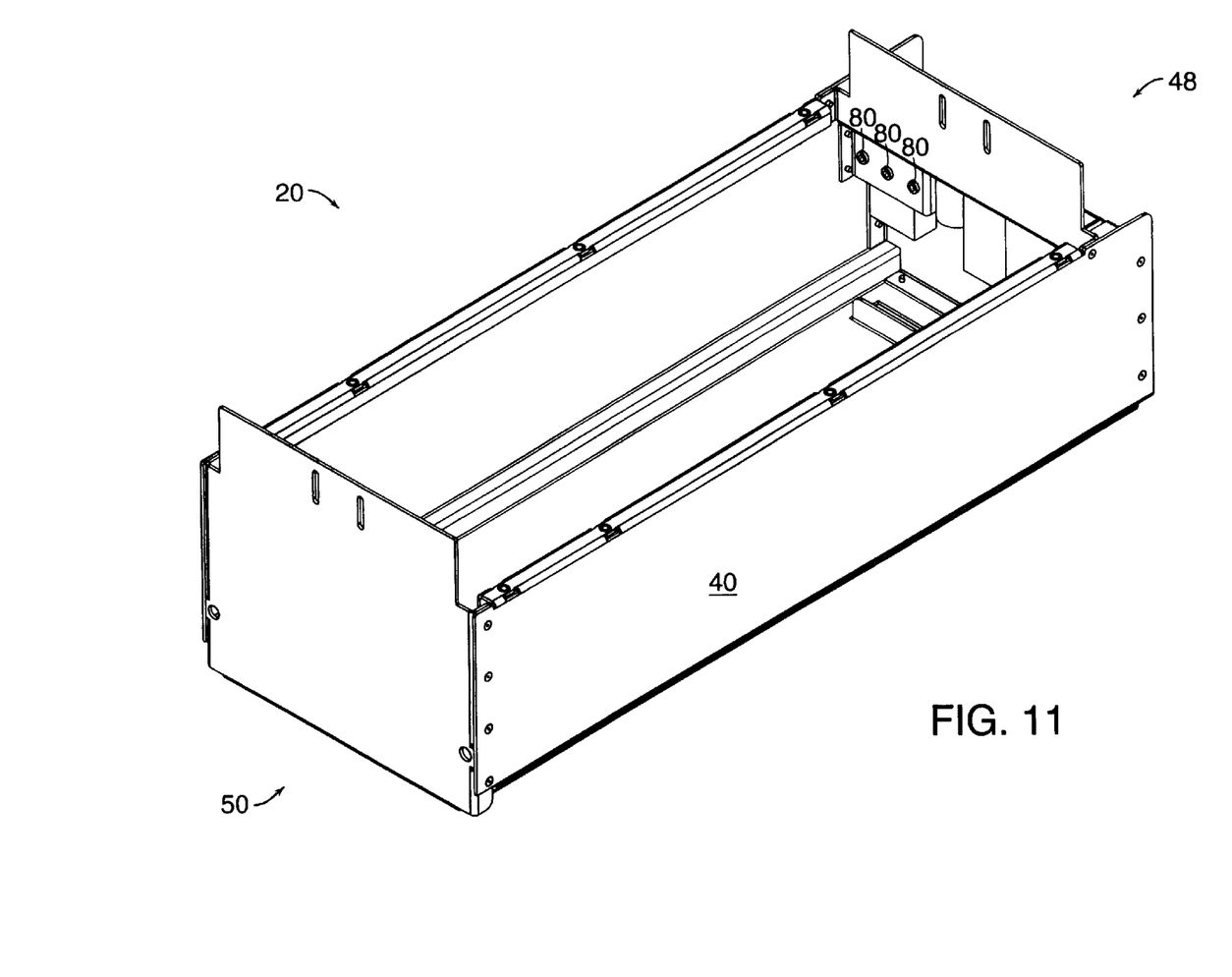
FIG. 11 is FIG. 5 with the batteries removed.

Referring to FIGS. 10 and 11, a housing 40 is shown with batteries 70 removed. Batteries 70 will be connected by leads, not shown, to terminals 80 within battery pack 20. Terminals 80 are controlled by switch 76 and dial 78.

Figure 12:
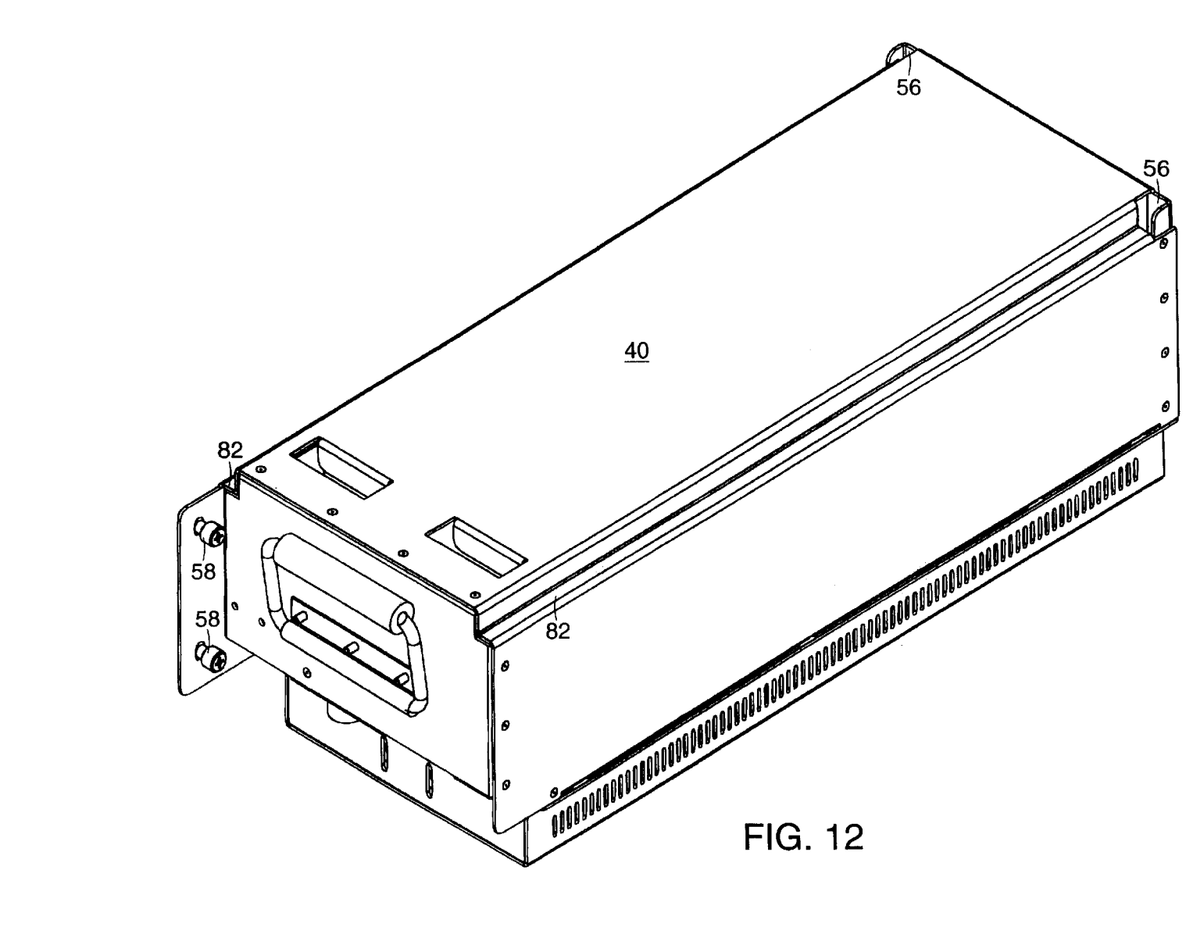
FIG. 12 is a bottom perspective view of FIG. 4.

Referring to FIG. 12, slots 82 in battery pack 20 are positioned for receiving stops 32 of cabinet frame 10. Slots 82 serve to direct the movement of the battery pack 20 as it is received into, and removed out from, compartment 16. Slots 82 also ensure that back plate 56 engages the stops 32 (FIG. 3), preventing the battery pack 20 from being removed from the cabinet in a single sliding motion.

Figure 13:
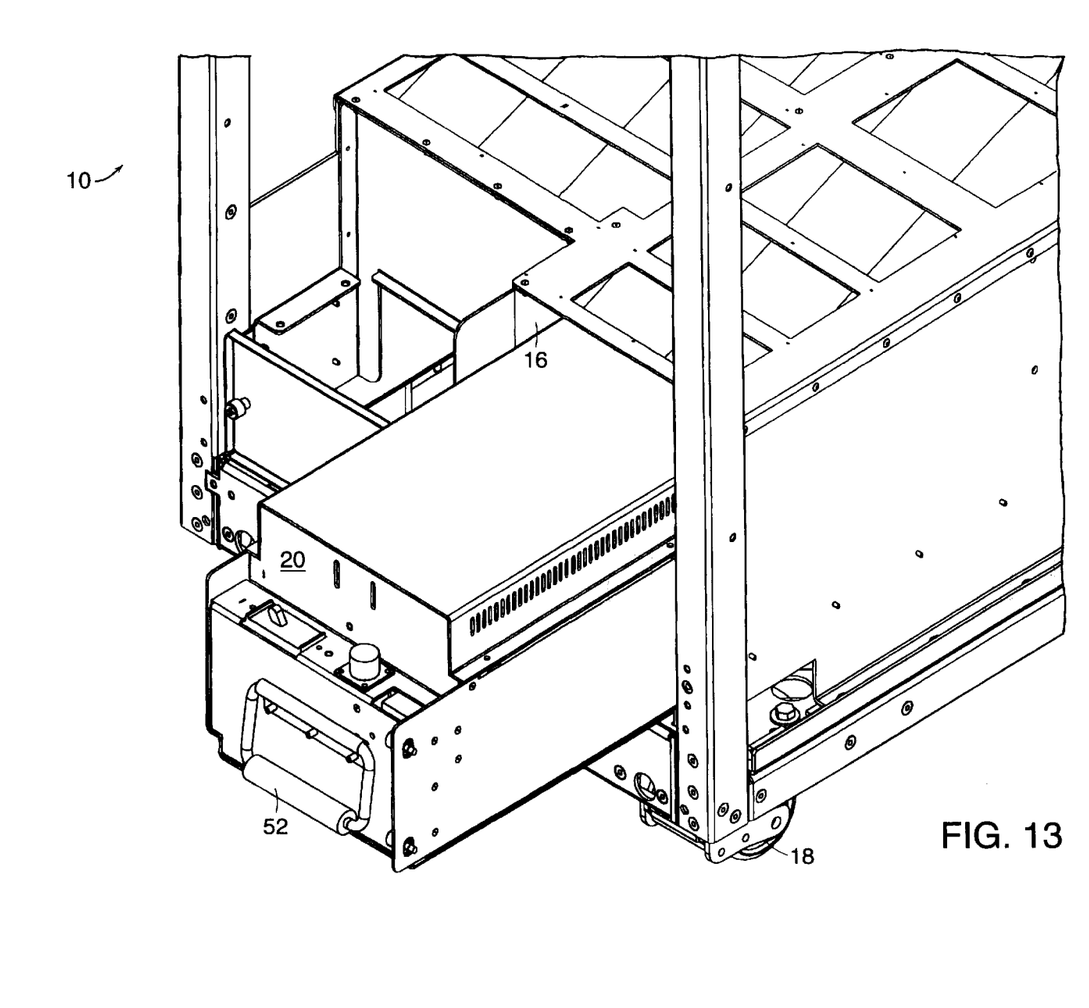
FIG. 13 is FIG. 2 with a battery pack partially removed from its compartment.
Figure 14:
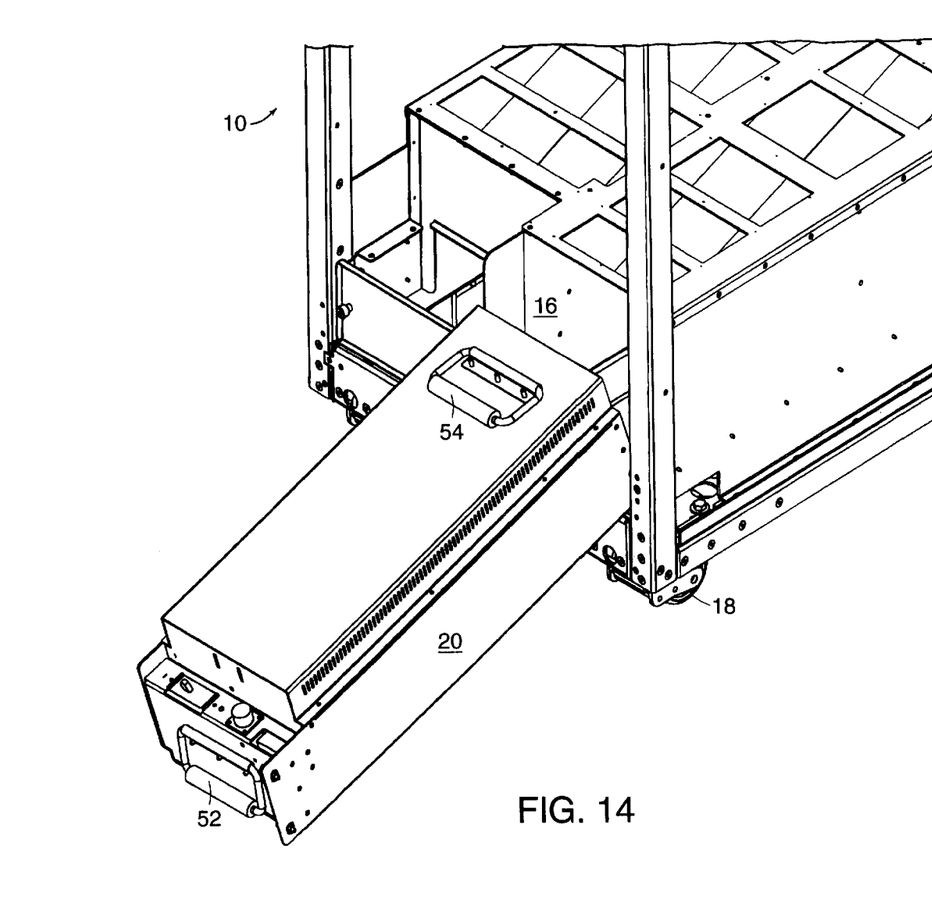
FIG. 14 is FIG. 13 with a battery pack almost completely removed from its compartment.
Figure 15:
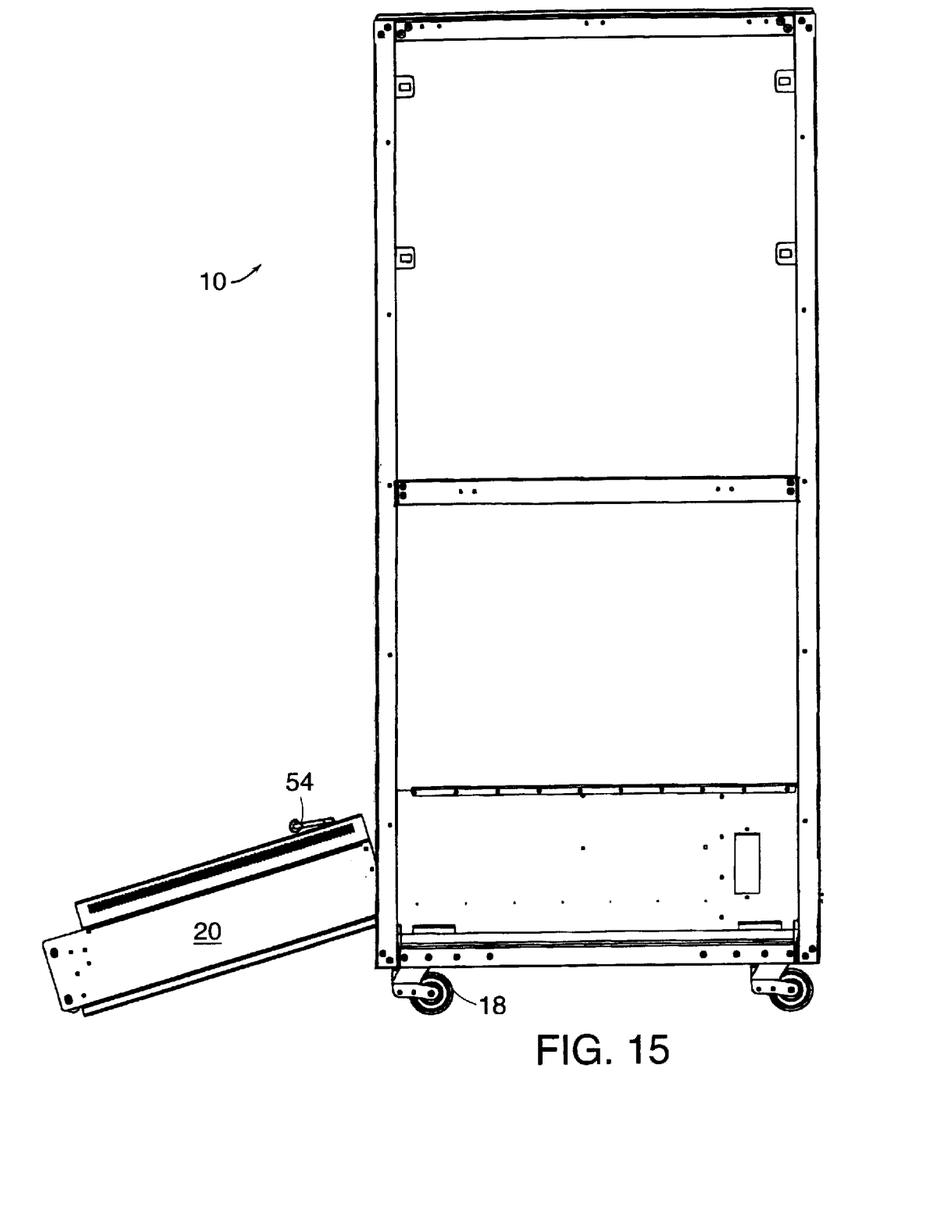
FIG. 15 is a side view of FIG. 14 showing the whole cabinet frame.

Referring now to FIGS. 13, 14 and 15, battery pack 20 is shown as it is being slid out from, and engaged by stops 32 of, cabinet frame 10. FIG. 13 shows battery pack 20 as it is approximately a third of the way removed from compartment 16. Battery pack 20 has been pulled into this position by manually using pull handle 52.

FIG. 14 shows battery pack 20 as it engages stops 32, preventing the pack from sliding out of compartment 16 on rails 20 in a single sliding motion. FIG. 15 shows a side view of battery pack 20 engaged by stops 32 requiring manual lifting of the rear end 50 using lift handle 54. To completely remove battery pack 20 from cabinet frame 10 back plate 56 of rear end 50 must be lifted over stops 32 (FIG. 3). Once this is accomplished battery pack 20 is removed from the cabinet to be inspected or possibly replaced by another battery pack.

Other embodiments are within the spirit and scope of the appended claims.

What is claimed is:

1. A cabinet, comprising:
    a plurality of compartments disposed in an interior of the cabinet, such interior being configured to house electrical components;
    a battery pack disposed within one of the cabinet compartments, the battery pack comprising;
        a housing having a bottom surface;
        a plurality of batteries disposed side-by-side within the housing, the batteries storing power to be supplied to electrical components housed within the cabinet; and
        a removable cover for the housing, such cover providing access to the batteries in the housing when the battery pack has been removed from the cabinet; and
    a rail affixed to a bottom surface of one of the compartments having disposed therein the battery pack, the rail having an upper surface, the bottom surface of the housing being slidable on an upper surface of the rail, such upper surface providing a low-friction surface for receiving, and removing, the battery pack into, and out from, respectively, said one of the compartments as the bottom surface of the housing slides along the upper surface of the rail.

2. The cabinet in claim 1 wherein the compartment configured to receive the battery pack is located at a base of the cabinet lowering the center of gravity of the cabinet when said battery pack is disposed within such compartment.

3. The cabinet in claim 1, further comprising, a stop mechanism having a first member fixed to the bottom surface of the compartment and laterally spaced from the rail and a second member affixed to the bottom surface of the housing, such first and second members being aligned to prevent the removal of the battery pack from such compartment in a sliding movement of the housing along the rail.

4. The cabinet in claim 1 wherein the battery pack has a finger screw, the finger screw engaging the cabinet, securing said battery pack within said compartment.

5. The cabinet in claim 1 wherein the cabinet further comprises a guide pin within one of the compartments having disposed therein said battery pack, the guide pin engaged by a portion of the battery pack, the engaged guide pin holding the battery pack securely within said compartment.

6. The cabinet in claim 1 wherein the battery pack contains a removable member attached securing the plurality of batteries within the housing.

7. The cabinet in claim 1 wherein the battery pack has a switch controlling the function of the housed batteries.

8. The cabinet in claim 1 wherein the battery pack has vents allowing air to circulate within the battery pack cooling said batteries.

9. The cabinet in claim 1 wherein the housing of the battery pack is riveted together.

10. The cabinet in claim 3 wherein the housing has a back plate providing the second member of the stop mechanism for engaging the first member of the stop mechanism, the back plate engaging such first member as said battery pack is almost completely removed from the cabinet.

11. The cabinet in claim 3 wherein the battery pack further comprises:

a pull handle for manually pulling the battery pack when removing the pack from such cabinet compartment, and a lift handle for manually lifting the battery pack when engaged by said first member of the stop mechanism when removing the battery pack from, or placing the battery pack into, the cabinet.

12. The cabinet in claim 10 wherein the second mechanism has a slot for receiving the first member of the stop mechanism, the slot directing the movement of the battery pack as it is received into, and removed out from, said compartment to ensure the back plate engages the first member of the stop mechanism.

* * * * *